United States Patent [19]

Grenier

[11] Patent Number: 4,463,370
[45] Date of Patent: Jul. 31, 1984

[54] SEMICONDUCTOR DEVICE FOR USE IN MEMORY CELLS

[75] Inventor: Didier J. R. Grenier, Caen, France

[73] Assignee: U.S. Philips Corporation, New York, N.Y.

[21] Appl. No.: 315,691

[22] Filed: Oct. 28, 1981

[30] Foreign Application Priority Data

Nov. 7, 1980 [FR] France .................. 80 23825

[51] Int. Cl.$^3$ ........................... H01L 27/04
[52] U.S. Cl. ....................... 357/50; 357/49; 357/48; 357/51
[58] Field of Search .............. 357/51, 50, 49, 48

[56] References Cited

U.S. PATENT DOCUMENTS

| | | | |
|---|---|---|---|
| 4,005,453 | 1/1977 | Le Can et al. ............. | 357/50 X |
| 4,032,902 | 6/1977 | Herndon ................... | 357/50 X |
| 4,246,592 | 1/1981 | Bartleh ..................... | 357/51 X |
| 4,246,593 | 1/1981 | Bartleh ..................... | 357/51 X |
| 4,255,674 | 3/1981 | Grenier et al. ............ | 357/51 X |
| 4,258,380 | 3/1981 | Roger ...................... | 357/51 |
| 4,292,730 | 10/1981 | Ports ....................... | 357/51 X |

*Primary Examiner*—Andrew J. James
*Assistant Examiner*—W. Mintel
*Attorney, Agent, or Firm*—Robert T. Mayer; Steven R. Biren

[57] ABSTRACT

An integrated circuit element which is laterally insulated by oxide includes a transistor and a resistor. The resistor is formed by an elongation of the base and includes an emitter of the transistor. A pinching zone is present beneath the emitter and is selectively doped with respect to a pinching zone located beneath a further emitter of the transistor. The integrated circuit element may be combined with another substantially identical element to form a compact memory cell.

3 Claims, 3 Drawing Figures

SEMICONDUCTOR DEVICE FOR USE IN MEMORY CELLS

BACKGROUND OF THE INVENTION

The invention relates to a semiconductor device having a semiconductor body comprising at least a surface-adjoining island-shaped region which is bounded by a sunken dielectric and in which a transistor and a resistive zone are provided with a first semiconductor region of a first conductivity type which comprises a collector region of the transistor. An overlying, surface-adjoining second semiconductor region of a second conductivity type opposite to the first comprises a base of the transistor and the resistive zone, and at least a third and a fourth surface region of the first conductivity typeare present which form emitter regions of the transistor. The resistive zone comprises a part of the second semiconductor region between two connections to the semiconductor region of which a first connection also forms the base contact of the transistor, the third surface region of the first conductivity type which forms an emitter region being present between the two connections.

Such semiconductor devices are used in bistable memory cells having two transistors with two emitters for memory matrices in the so-called emitter coupled logic. The base and the collector regions of the two transistors are coupled crosswise, while the collector regions are connected to a first supply line via resistors which serve as loads. An emitter region of each transistor is connected to a second supply line, and the two other emitter regions are connected to a first and a second read and write line, respectively.

A semiconductor device of the above-mentioned type is known from French patent application No. 2,413,782. The resistive zone is formed by a lateral extension of the base zone of the transistor. In a memory cell composed of such semiconductor devices, one of the emitter regions of each transistor is integrated in a lateral extension of the base region which serves as a resistive zone. Such a device configuration is advantageous because it contributes to a considerable decrease of the dimensions of the cells with respect to those of the cells with a similar structure in which the emitter regions and the resistors are all accommodated in separate parts of the base region. However, such a device has the disadvantage that by integration of the emitter in the resistive zone the cross-section of the resistive zone is reduced over a part of its length. In order to avoid reducing the cross-section over the length considered to only that of the narrow space between the emitter region and the underlying collector region - in which space the resistivity of the semiconductor material is high due to its deep location the emitter region is divided into two separate zones. In this manner a channel has been provided therebetween in a piece of semiconductor material which encloses the surface layers in which the material has a much lower resistivity than that in the said deep-situated narrow space and it becomes possible to combine the integration of the emitter in the resistive zone and to obtain an ohmic value suitable for said resistor.

However, such a measure necessitates the widening of the integration island for accommodating the channel. In other words the surface thereof has to be incresed, which is contradictory to the object in the field of integrated circuits, and in particular for memory circuits, of an ever larger integration density.

One has to take into account on the one hand the width of the channel itself, which in series production due to the normally permitted tolerances, in particular those on the dimensions of the mask apertures, may not be smaller than 3 $\mu$m, and on the other hand the fact that the two emitter zones which surround the channel further adjoin edges of the sunken dielectric which laterally bound the island-shaped region. As every zone must be given a sufficient width according to a direction transverse to the edges and parallel to the transverse direction of the channel so that with a maximum mutual alignment error of the masks which are used to form first of all the edge and then the zones, one of these does not become too narrow and for the greater part is embedded in the dielectric, which would involve an unacceptable reduction of the overall area of the emitter, one is compelled to choose the width of the island to be 30 to 40% larger than in the absence of the channel.

SUMMARY OF THE INVENTION

One of the objects of the invention is to remove the above-mentioned disadvantages in memory cells of the type described with dielectric insulation. Another object of the invention is to provide a semiconductor device of the type described having a compact pattern which enables the integration of a maximum number of cells.

The invention is based on the recognition that this can be achieved in that at least at the area of the third surface region the resistivity of the second semiconductor region at least between said surface region and the collector region can be reduced.

A semiconductor device according to the invention is characterized in that at the area of the third region the resistivity of the second semiconductor region, at least in so far as viewed in a cross-section perpendicular to the surface, situated between said third region and the underlying collector region is lower than that of other parts of the second semiconductor region situated at a distance below the surface which, viewed at least in across-section perpendicular to the surface, is at least equal to the depth of the third region.

This corresponds substantially to a selective overdoping of the pinching zone between the third surface region and the collector region so that the ohmic value of the part of the resistive zone which forms the pinching zone is reduced to a chosen value. As a result of this the overall ohmic value of the resistive zone becomes suitable to ensure a correct operation of the circuit element formed by the transistor and the resistive zone.

The use of the invention has various advantages, as explained below.

First of all, it is possible in this manner to give the island bounded by the dielectric a small width. Because the resistivity of the pinching zone can be reduced to a value which is just slightly lower than the usual value (that is to say the value thereof with extra doping), the cross-section of said pinching zone can as a matter of fact be reduced: on the one hand it is no longer necessary to provide a channel through the third surface region (first emitter region) as in the device according to the French Patent application mentioned above, so that a reduction of the width of the said cross-section is obtained; on the other hand the length over which the pinching takes place can be reduced in the longitudinal direction of the resistor by slightly reducing the dimension of the third surface region (first emitter region) in the same direction due to the better conditions for photo-etching of the emitter window which, because it is larger than any of the windows which are necessary in the case of an emitter divided into two zones, can be made narrower.

From this reduction of the dimensions of the pinching zone there follows a general reduction of the area which is occupied by such an integrated circuit element. This is favorable for two reasons: first of all because this reduction contributes to an increase of the integration density; subsequently because as a result of this, due to an associated reduction of the capacity (in particular that of the collector-base junction and underlying collector-substrate junction) it is possible to obtain a considerable gain in response rate.

On the other hand, the reduction of the resistivity of the pinching zone by overdoping of said pinching zone—and consequently also the whole resistance—involves making the ohmic values which relate to the exterior field (for example, caused by surface charges) less sensitive to changes. As a result of this it is also possible to achieve an efficacious reduction of the spreading of the values between the resistances of the integrated elements of one manufacturing series as a result of small process variations.

Overdoping of the pinching zone also involves the gain factor of the part of the transistor which corresponds to the third surface region (first emitter region) being reduced and becoming smaller than that of the part of the same transistor corresponding to the fourth surface region (second emitter region). It is to be noted, however, that in the case of application to bistable cells for memory matrices and with the above-indicated interconnections, that is to say the connection of a first emitter region (third surface region) to a supply line and that of the second emitter region (fourth surface region) to a control line, the gain reduction does not affect the operation of the cells. The first emitter regions of the two transistors of a cell are in fact not connected to the periphery of the memory; they only cause a current to flow with which the information can be retained in the cell so that the corresponding transistor part need not have a high gain factor. On the contrary, the fourth surface regions (second emitter regions) which are to process read and write information must correspond to transistors having a high gain factor.

As indicated above, the invention relates in particular, but not exclusively, to bistable cells for memory matrices of the ECL type. Such a preferred embodiment of a semiconductor device in accordance with the invention is characterized in that the transistor and the resistive zone, hereinafter termed first transistor and first resistive zone, respectively, form part of a memory cell which, in addition to the island-shaped region, comprises a second island-shaped region which is bounded by the dielectric and in which a second transistor and resistive zone substantially identical to the first transistor and resistive zone, respectively, are provided in which the base and collector regions of the two transistors are connected together crosswise while, (i.e. cross-coupled) the other connection of the resistive zones is connected to a first supply line, the third surface region of each transistor which forms an emitter region is connected to a second supply line and the fourth surface regions which also form emitter regions are connected to read/write lines.

As regards the manufacture of the integrated circuit elements and of cells in accordance with the invention, the invention relates in particular to elements and cells which are insulated laterally by a dielectric and which exhibit the advantage of greater compactness because the base and resistor regions may directly adjoin the dielectric, a configuration which cannot be realized in the case of the conventional insulation by a p-n junction. As will become apparent hereinafter, the contact windows and the contacts in this embodiment may overlap the dielectric, which is advantageous when the regions to be connected have a small area.

Circuit elements according to the invention may be manufactured according to methods which are known from the manufacturing techniques of integrated circuits and which comprise in particular epitaxial deposition, diffusion, ion implantation, oxidation, etching, metallization, and photo-etching. Such a circuit element can be obtained by deposition of an epitaxial silicon layer, for example of the N type, on a P type substrate, after the formation of an N+ buried collector layer. The dielectric is then formed, which laterally bounds the element by local etching of silicon succeeded by oxidation. The N+ emitter regions are then formed, after which the surface layer on which the base region and the resistor are present are formed, all preferably by ion implantation.

According to a characteristic feature of the invention which is incorporated in the present mode of manufacture, a deep implantation of P type ions is performed in the pinching zone which separates the first emitter region from the underlying collector region, so as to increase the degree of doping of said zone and consequently to reduce the resistivity of the material in question. A correct redistribution of the impurities in the semiconductor body is then obtained by annealing.

Because of the selective overdoping of the pinching zone which is present below the third surface region, after the annealing said semiconductor material part has a lower resistivity and a considerably larger thickness compared with the corresponding semiconductor material part which is present between the fourth surface region and the said first region.

BRIEF DESCRIPTION OF THE DRAWING

The invention will now be described in greater detail, by way of example, with reference to the accompanying drawing, in which.

DESCRIPTION OF THE PREFERRED EMBODIMENT

Figure 1:
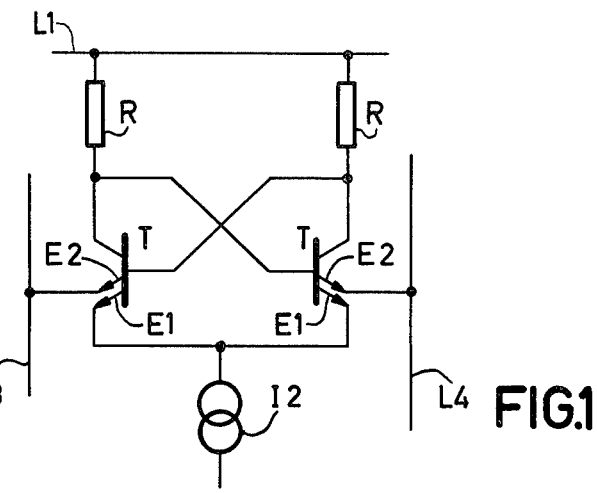
FIG. 1 diagrammatically shows the electrical circuit diagram of a bistable memory cell as used, for example, in the ECL technique.

The diagram of FIG. 1 shows the two transistors T with which an ECL memory cell is manufactured. In the present case the two transistors are substantially identical, their base and collector regions are connected crosswise; the collector regions are connected to a first supply line $L_1$ via resistors R having a substantially equal value; an emitter region $E_1$ of each transistor is connected to a second supply line, indicated by means of a current source $I_2$, which provides the current for maintaining the information in the cell; of the two other emitter regions $E_2$, one is connected to a first control and write line $L_3$, while the other is connected to a second control and write line $L_4$.

The manufacture of a cell according to the diagram of FIG. 1 in semiconductor technology necessitates the manufacture of the cell in two mutually separated islands each comprising a transistor and the collctor resistor of the other transistor.

Figure 2:
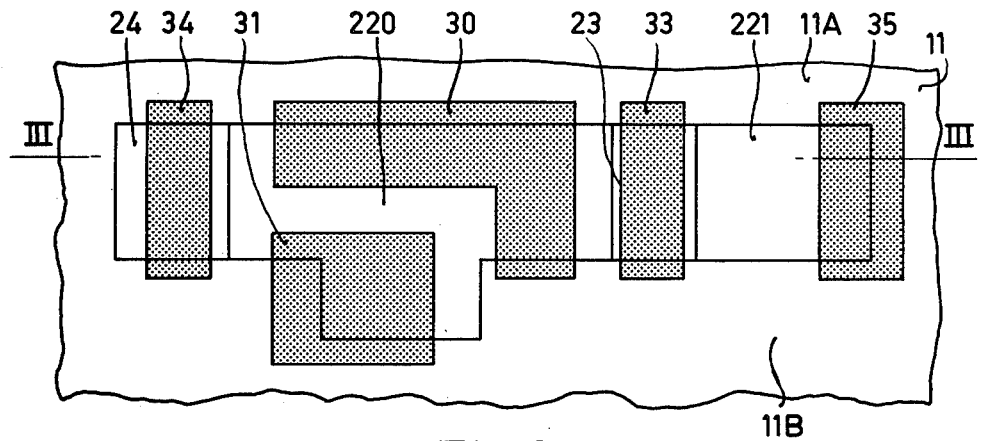
FIG. 2 is a diagrammatic plan view of an integrated circuit element, comprising a transistor having two emitters and a resistor.
Figure 3:
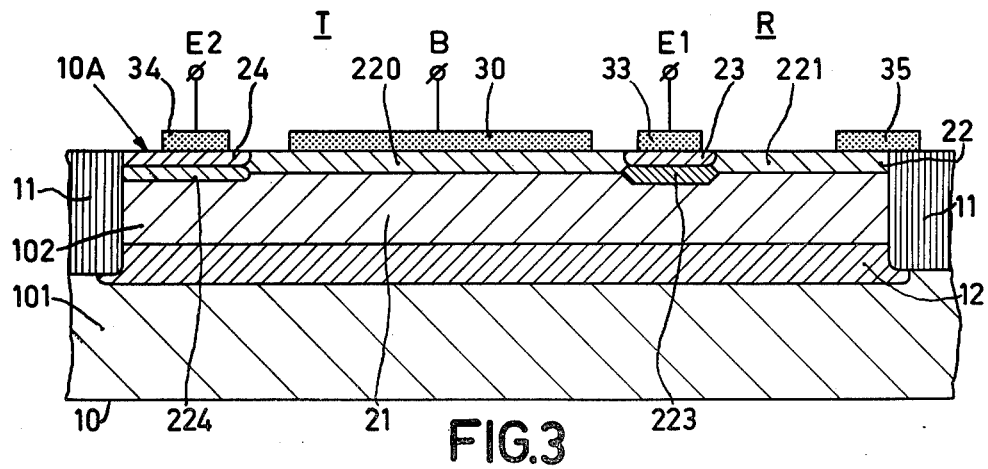
FIG. 3 is a diagrammatic sectional view taken on the line III—III of FIG. 2 showing the invention.

FIGS. 2 and 3 show a part of the cell in a plan view and in a sectional view, respectively. The part is formed in the semiconductor body 10 formed by a substrate 101 which is covered with an epitaxial layer 102 and which has an upper surface 10A which forms the surface of said body in which all components are realized and on which the connections are made. It is laterally bounded by a sunken dielectric 11 and in depth by a buried layer 12. The part shown furthermore comprises: a first region 21 of the first conductivity type (which forms part of the epitaxial layer 102 in whih the buried layer 12 is also of a first conductivity type, while the substrate 101 is of the second conductivity type) which forms the collector of the transistor T,

- a second region 22 of the second conductivity type which is provided in the layer 102 and adjoins the surface 10A; this region 22 comprises the base 220 of the transistor T and the resistive zone 221 (corresponding to the resistor R) which is a lateral continuation of the base 220;
- a third and fourth region 23 and 24, respectively, of the first conductivity type which are provided inside the second region 22 which also adjoin the surface 10A and form two emitter regions of the transistor T.

The resistive zone 221 extends between a first contact 30 which is also the contact B of the base 220 and a second contact 35 which is situated at the edge of the part in question.

The third region 23 which corresponds to the emitter $E_1$ of FIG. 1 is present in the part 221 of the region 22, that is in the part which forms the resistive zone. The fourth region 24 which corresponds to the emitter $E_2$ of FIG. 1 is present in the other part 220 of the region 12, that is in the actual base of the transistor; the regions 23 and 24 and their respective contacts 33 and 34 are present on either side of the base contact 30.

The connection between the collctor region 21 and the associated collector contact 31 can be made by means of a deep collector connection zone not visible in FIG. 3.

The regions 21, 22, 23, 24 are bounded entirely or partly by the dielectric 11. The emitter regions 23 and 24 adjoin two opposite walls 11A and 11B of the insulating dielectric and extend thus over the whole width of the region 22.

Measures as described above and which relate in particular to the lateral insulation by the sunken dielectric, to the provision of the two emitter regions 23 and 24 opposite to the base contact 30, and to the integration of the region 23 in the resistor 21 are known from French patent application No. 2,413,782. The object of these measures as well as those which consist of providing the second contact 35 of the resistor 221 on the line which is determined by the regions 23 and 24 and the base contact 30, is to reduce the surface which is occupied by a memory element on the semiconductor body, and to thereby obtain a maximum integration density.

In the structure used here, the semiconductor part 223 of the second region 22 which is present between the third surface region (first emitter region) 23 and the first underlying collector region 21 (and which thus forms part of the resistive zone 221), has a resistivity which is smaller than that of the other parts of the second region 22 (which form part in particular of the base 220) which are present at a distance below the surface 10A of the semiconductor body which, at least in a cross-sectional view and perpendicular to the surface, is at least equal to the depth of the third region 23.

The part 223 of semiconductor material is an essential part of the resistor 221 because it is present at the area of the layer portion 22 which is situated between the base contact 30 (first contact of the resistor) and the contact 35 (second contact of the resistor). It is a part having a comparatively small cross-section (thickness: 0.10 to 0.15 $\mu$m) with respect to that of the remainder of the resistor (thickness: 0.30 to 0.45 $\mu$m); it is also a deep part of the region 22 (in which in the absence of a specific treatment) the resistivity is high. The ohmic value of the resistor 221 is thus closely dependent on that of the part 223. It is in this part 223 that the measures according to the invention are used to determine the ohmic value thereof at a value which is suitable for a correct operation of transistor connected to the resistor 221.

The cross-section of the part 223 could be increased by increasing the thickness of the pinching zone. However, as a result of this, the thickness of the emitter 23 would have to be reduced (the thickness of the region 22 is preferably not influenced to prevent undesired change of said thickness at the area of the other emitter 24 of the transistor). This method is not very suitable for it would involve the separate manufacture of the emitter 23.

According tothe invention, the resistivity of the material of the part 223 is influenced by an additional selective doping of the material according to a method which will be described hereinafter.

On a substrate 101 of silicon, for example of the P type, are formed zones for the buried layers 12 of the $N^+$ type, the number of which depends on the circuit elements to be realized; an epitaxial layer 102 of N type is then deposited after which a mask is provided photolithographically to etch grooves and to subsequently form, by means of thermal oxidation, the sunken silicon oxide 11 which separates the elements from each other. The next operation is a diffusion or a deep local implantation via a suitable mask of collector contact zones of the $N^+$ type. By means of an implantation of the $N^+$ type which is carried out via another mask, the emitter regions 23 and 24 can be formed. An implantation of P type ions to provide the base regions 220 and the resistor 221 is then carried out. By means of a deep implantation of P type ions which is carried out via a mask which is permeable to ions only at the area of the surface of the emitter region 23, the doping concentration in the pinching region 223 is increased and the resistivity thereof is reduced. Before providing connection contacts and an interconnection pattern on the surface 10A, the device is subjected to an annealing treatment so as to obtain a suitable distribution of the impurities.

Methods known in semiconductor technology to obtain a self-alignment of the various masks by means of a main mask (for example of silicon oxide and/or nitride), of duplicate masks and of screening masks (for example of lacquer) and which result in an accurate definition of the geometry of the zones and regions, may be used within the scope of the present method to provide circuit elements and cells in accordance with the invention.

The dimensions of various regions of the device, especially the thickness, and the doping profile in said regions of course depend on the conditions in the various implantations. A few values are given below which further describe said conditions, as well as the values of the resistivities for a given example:

- the epitaxial layer 102 has a thickness of 0.8 to 2.5 μm and the sheet resistance thereof is 5 to 40 k $\Omega/\square$.
- the region 22 is formed by implantation of boron ions with a dose of 1 to $2.10^{14}$ at/cm$^2$ at an energy of 25 to 70 keV. The thickness thereof is 0.30 to 0.45 μm. The average sheet resistance thereof is 600 $\Omega/\square$. The sheet resistance in the deepest part near the collector-base junction is approximately 6000 to 7000 $\Omega/\square$.
- the regions of the emitters 23 and 24 are obtained by ion implantation of arsenic ions with a dose of 5 to $7.10^{15}$ at/cm with an energy of 25 to 35 keV. The thickness thereof is between 0.20 and 0.30 μm.
- an extra implantation of boron ions is used in the pinching zones 223 and a dose of $10^{14}$ to $10^{13}$ at/cm$^2$ with an energy level of 50 to 150 keV. The sheet resistance in this zone, which initially is 6000 to 7000 $\Omega/\square$, after this treatment is between 1500 and 2000 $\Omega/\square$.

The above given resistance values are those which have been obtained after the ultimate thermal treatment. This treatment is carried out in a nitrogen atmosphere and lasts 30 minutes, during which time the temperature of the furnace is maintained between 900° and 950° C.

Due to the comparatively higher doping of the pinching zone 223 which is situated below the emitter 23 compared to that of the pinching zone 224 which is situated below the emitter 24, the impurities of the zone 223 migrate slightly deeper into the underlying collector region 21 than those of the zone 224 during the ultimate annealing treatment. The zone 224 is therefore slightly thinner than the zone 223 and simultaneously has a higher resistivity. As explained above it follows from this that the gain of the part of the transistor which corresponds to the emitter 24 is larger than that of the part of the same transistor corresponding to the emitter 23 without, however, said unbalance detrimentally influencing the operation of the element and of the memory cell of which it forms a part.

An integrated circuit element for an ECL memory cell which is constructed and manufactured as indicated above occupies at the surface of the wafer an area of approximately 2000 μm$^2$ (in which half of the width of the sunken oxide 11 which separates the adjoining elements has been taken into account).

By way of comparison it is to be noted that a similar integrated circuit element of which the emitter region 23 is split into two zones which are separated by a channel has a surface area of 2700 μm$^2$.

By connecting the two integrated elements of the invention according to the circuit diagram as shown in FIG. 1, a bistable memory cell is formed which occupies a small area. The combination takes place by means of providing suitable metal tracks on the surface 10A.

What is claimed is:

1. A semiconductor device having a semiconductor body comprising at least a surface-adjoining island-shaped region which is bounded by a sunken dielectric and in which a first transistor and a first resistive zone are provided, said island-shaped region having a first semiconductor region of a first conductivity type which comprises a collector region of the transistor, an overlying, surface-adjoining second semiconductor region of a second conductivity type opposite to the first which comprises a base of the transistor and the resistive zone and in which at least a third and a fourth surface region of the first conductivity type which form emitter regions of the transistor are provided, the resistive zone comprising a part of the second semiconductor region between first and second connections to the second semiconductor region, said first connection also forming the base contact of the transistor, the third surface region of the first conductivity type which forms an emitter region being present between the first and second connections, the resistivity of the second semiconductor region at the area of the third region, in a direction perpendicular to the surface, between said third region and the underlying collector region, being lower than that of other parts of the second semiconductor region present at a distance below the surface which, in a direction perpendicular to the surface, is at least equal to the depth of the third region.

2. A semiconductor device as claimed in claim 1, characterized in that, viewed at in a direction perpendicular to the surface, the part of the second semiconductor region present between the third region and the collector region has a lower resistivity and a larger thickness than the part present between the fourth region and the collector region.

3. A semiconductor device as claimed in claim 1 or 2, characterized in that the transistor and the resistive zone, respectively, form part of a memory cell which, in addition to the island-shaped region, comprises a second island-shaped region which is bounded by the dielectric and in which a second transistor and a second resistive zone substantially identical to the first transistor and first resistive zone, respectively, are provided, and in which the base and collector regions of the two transistors are cross-coupled together, while the second connections of said resistive zones are connected to a first supply line, the third surface region of each transistor which forms a first of said emitter regions is connected to a second supply line, and the fourth surface region of each transistor which forms a second of said emitter regions is connected a read/write line.

* * * * *

UNITED STATES PATENT AND TRADEMARK OFFICE
CERTIFICATE OF CORRECTION

PATENT NO. : 4,463,370
DATED : July 31, 1984
INVENTOR(S) : DIDIER J.R. GRENIER

It is certified that error appears in the above-identified patent and that said Letters Patent is hereby corrected as shown below:

```
Claim 3, last line, after "connected" insert
--to--
```

Signed and Sealed this

Fourth Day of June 1985

[SEAL]

Attest:

DONALD J. QUIGG

Attesting Officer     Acting Commissioner of Patents and Trademarks